US012061972B2

(12) United States Patent
Huang et al.

(10) Patent No.: US 12,061,972 B2
(45) Date of Patent: Aug. 13, 2024

(54) HARDWARE IMPLEMENTATION OF A NEURAL NETWORK

(71) Applicant: Imagination Technologies Limited, Kings Langley (GB)

(72) Inventors: Xiran Huang, Hertfordshire (GB); Cagatay Dikici, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 884 days.

(21) Appl. No.: 17/106,892

(22) Filed: Nov. 30, 2020

(65) Prior Publication Data

US 2021/0174181 A1 Jun. 10, 2021

(30) Foreign Application Priority Data

Nov. 29, 2019 (GB) ...................................... 1917521

(51) Int. Cl.
*G06N 3/063* (2023.01)
*G06N 3/04* (2023.01)
(52) U.S. Cl.
CPC .............. *G06N 3/063* (2013.01); *G06N 3/04* (2013.01)
(58) Field of Classification Search
CPC .......... G06N 3/04; G06N 3/045; G06N 3/063; G06N 3/00; G06N 5/00; G06N 7/00; G06N 10/00; G06N 20/00; G06N 99/00
See application file for complete search history.

(56) References Cited

U.S. PATENT DOCUMENTS

| 10,912,877 B2 | 2/2021 | Fabig et al. |
| 11,797,345 B2 * | 10/2023 | Poddar .................... G06N 3/045 |
| 2019/0220734 A1 | 7/2019 | Ferdman et al. |
| 2019/0220742 A1 | 7/2019 | Kuo et al. |
| 2019/0243755 A1 | 8/2019 | Luo et al. |
| 2019/0244091 A1 | 8/2019 | Weber et al. |
| 2019/0258923 A1 * | 8/2019 | Torng .................... G06N 3/045 |
| 2019/0266485 A1 | 8/2019 | Singh et al. |
| 2019/0303762 A1 | 10/2019 | Sui et al. |
| 2021/0241082 A1 | 8/2021 | Nagy et al. |

FOREIGN PATENT DOCUMENTS

| WO | 2018/071546 A1 | 4/2018 |
| WO | 2019/154546 A1 | 8/2019 |

OTHER PUBLICATIONS

Stoutchinin et al; "Optimally Scheduling CNN Convolutions for Efficient Memory Access"; IEEE Transactions on Computer-Aided Design of Integrated Circuits and Systems; pp. 1-14.
(Continued)

*Primary Examiner* — Luis A Sitiriche
(74) *Attorney, Agent, or Firm* — Potomac Law Group, PLLC; Vincent M DeLuca

(57) ABSTRACT

A hardware implementation of a neural network and a method of processing data in such a hardware implementation are disclosed. Input data for a plurality of layers of the network is processed in blocks, to generate respective blocks of output data. The processing proceeds depth-wise through the plurality of layers, evaluating all layers of the plurality of layers for a given block, before proceeding to the next block.

20 Claims, 9 Drawing Sheets

(56) References Cited

OTHER PUBLICATIONS

Alwani et al., "Fused-Layer CNN Accelerators," 49th Annual IEEE/ACM Int'l Symposium on Microarchitecture, 2016, DOI: 10.1109/MICRO.2016.778725.

Weber et al., "BrainSlug: Transparent Acceleration of Deep Learning Through Depth-First Parallelism," 2018, available from https://arxiv.org/pdf/1804.08378.pdf.

Azizimazreah et al; "Shortcut Mining: Exploiting Cross-layer Shortcut Reuse in DCNN Accelerators"; 2019 IEEE International Symposium on High Performance Computer Architecture (HPCA); Feb. 16, 2019; pp. 94-105.

Chen, Y. et al.: "Eyeriss: An Energy-Efficient Reconfigurable Accelerator for Deep Convolutional Neural Networks", 2016 IEEE International Solid-State Circuits Conference (ISSCC'16), vol. 2016, pp. 262-263 (Year: 2016).

Gong, L. et al.: "MALOC: A Fully Pipelined FPGA Accelerator for Convolutional Neural Networks with All Layers Mapped on Chip", 2018, IEEE Transactions on Computer-Aided Design of Integrated Circuits and Systems, vol. 37, No. 11, pp. 2601-2612 (Year: 2018).

Huan, Y. et al.: "A 3D Tiled Low Power Accelerator for Convolutional Neural Network", 2018 IEEE International Symposium on Circuits and Systems (ISCAS), vol. 2018, pp. 1-5.

Wei, X. et al.: "TGPA: Tile-Grained Pipeline Architecture for Low Latency CNN Inference", 2018 IEEE/ACM International Conference on computer-Aided Design (ICCAD), vol. 2018, pp. 1-8, 2018.

Xu, et al.: "Efficient fast convolution architectures for convolutional neural network", 2017, 2017 IEEE 12th International Conference on ASIC (ASICON), vol. 12 (2017), pp. 904-907 (Year: 2017).

\* cited by examiner

HARDWARE IMPLEMENTATION OF A NEURAL NETWORK

BACKGROUND

A Deep Neural Network (DNN) is a type of artificial neural network that can be used for machine learning applications. In particular, a DNN can be used in signal processing applications, including image processing and computer vision applications.

DNNs have been implemented in applications where power resources are not a significant factor. Despite this, DNNs have application in a number of different technical fields in which the resources of the hardware used to implement the DNNs is such that power consumption, processing capabilities, or silicon area are limited. There is therefore a need to implement hardware that is configured to implement a DNN (or at least part thereof) in an efficient manner—for example, in a manner that requires less silicon area or less processing power when operating. Moreover, DNNs can be configured in a number of different ways for a variety of different applications. There is therefore also a need for hardware for implementing a DNN to be flexible to be able to support a variety of DNN configurations.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A hardware implementation of a neural network and a method of processing data in such a hardware implementation are disclosed. Input data for a plurality of layers of the network is processed in blocks, to generate respective blocks of output data. The processing proceeds depth-wise through the plurality of layers, evaluating all layers of the plurality of layers for a given block, before proceeding to the next block.

According to one aspect, there is disclosed a method of processing data in a hardware implementation of a neural network, the hardware implementation comprising one or more first memory devices and one or more second memory devices, the neural network including a plurality of layers, the method comprising:
  providing, in the one or more first memory devices, weight data representing weights for the plurality of layers;
  providing, in the one or more first memory devices, input data for the plurality of layers;
  reading, from the one or more first memory devices, a first subset of the input data, representing a first block of the input data;
  reading the weight data from the one or more first memory devices;
  processing the weight data and the first subset of the input data, to evaluate each layer of the plurality of layers and thereby calculate a first block of output data; and
  writing the first block of output data to the one or more first memory devices.

According to one example, there is disclosed a method of processing data in a hardware implementation of a neural network, the hardware implementation comprising one or more first memory devices and one or more second memory devices, the neural network including a plurality of layers, the method comprising:
  providing, in the one or more first memory devices, weight data representing weights for the plurality of layers and input data for the plurality of layers;
  reading, from the one or more first memory devices, a first subset of the input data, representing a first block of the input data;
  reading, from the one or more first memory devices, the weight data;
  processing the weight data and the first subset of the input data, to evaluate each layer of the plurality of layers and thereby calculate a first block of output data, wherein evaluating at least one layer subsequent to a first layer of the plurality of layers comprises:
    reading output data of a preceding layer from the one or more second memory devices;
    processing the weight data and the output data of the preceding layer to evaluate the at least one layer, and thereby calculate output data of the at least one layer; and
    writing the output data of the at least one layer into the one or more second memory devices to be read during the evaluation of a subsequent layer; and
  writing the first block of output data to the one or more first memory devices.

The inventors have recognised that it may be advantageous to process a block of input data by evaluating several layers of the neural network in succession and thereby produce a block of output data. This depth-first processing of a subset of the input data can help to reduce memory-access overheads associated with writing/reading the output of each layer of the network to/from memory. This memory-access overhead may be significant in terms of time and/or energy cost—in particular, if the memory is off-chip memory.

Taking this depth-first approach to its logical extreme, it is possible to calculate, in each pass, just a single output data element at the end layer of the plurality of layers (instead of a block of output data as disclosed herein). Nevertheless, the present inventors have recognised that it may also be advantageous to produce a block of output data containing multiple output data elements, in one pass. This can facilitate more efficient hardware implementations. For example, in a parallel implementation, multiple processing elements can be applied to generate the output data elements, in parallel. This can enable efficient processing while exploiting the potentially overlapping data dependency to reduce memory bandwidth requirements.

The first subset (i.e., first block) of the input data is processed in its entirety through each individual layer of the plurality of layers before moving on to the next layer. That is, each layer is evaluated exactly once, in order to calculate the first block of output data. This is what is meant by processing the weight data and the first subset of the input data to calculate the first block of output data "in one pass". The input data may be multidimensional input data, comprising two or more dimensions. The input data may comprise 2-D images or feature maps. The plurality of layers may be a plurality of consecutive layers. The block of the input data may be a contiguous block of the input data. The block of output data may be a contiguous block of output data.

The first subset of the input data may be a subset selected in one dimension, two dimensions, or more dimensions. For example, if the input data comprises 2-D image data or feature-map data, having an x-dimension and a y-dimension.

The first subset may be selected in the x-dimension, the y-dimension, or both the x- and y-dimensions.

Here, the block of output data is the output data corresponding to the block of input data. The block of output data is therefore a subset of the complete output data. The block of output data may have the same number of dimensions as the input data.

In some embodiments, the first block of output data may be written to the one or more first memory devices before processing of a second subset of the input data commences (or completes). In some embodiments, the first block of output data may be written to the one or more first memory devices before reading of the second subset from the one or more first memory devices commences (or completes). In other embodiments (for example, in pipelined implementations), these conditions may be relaxed.

Evaluating a layer of the neural network means applying the weight data to the input data of that layer, to calculate output data. This may comprise multiplying input values in the input data by respective weights in the weight data, and summing the result of these multiplications to produce an output value in the output data. Output data of the current layer may be input data for a subsequent layer. At least one of the plurality of layers is a convolutional layer.

Note that the first layer of the plurality of layers need not be the first layer of the neural network. Likewise, the end layer of the plurality of layers need not be the final layer of the neural network. The plurality of layers may be a subset of the layers of the neural network. However, in some cases (especially for networks with a small number of layers), the plurality of layers may include all layers of the neural network.

The method may further comprise providing one or more processing elements, configured to process the weights and the first subset of the input data to evaluate each layer of the plurality of layers. Plural processing elements may operate in parallel, to evaluate a given layer of the neural network. This includes operating in parallel to evaluate the output layer. The neural network may be a deep neural network.

The output data may comprise or consist of p output data sets, each set comprising n output data elements ($p \geq 1$, $n \geq 1$, optionally $n \geq 2$). Each of the p output data sets may represent a plane of output data, such as a feature map. The number of output data sets may depend on the weight data in that the weight data comprises a set of weights to define each output data set. A set of weights may form a filter kernel, for example, with each filter kernel defining an output feature map.

The first block of output data may comprise a plurality of output data elements extending in one or more dimensions, and the first subset of the input data may comprise a plurality of input data elements extending in the one or more dimensions, and wherein each output data element depends on a respective sub-group of the input data elements, each sub-group having at least one input data element in common with at least one other sub-group. The output data elements thus depend on sub-groups of input data elements that overlap in the one or more dimensions. Here, an output data element "depending" on a sub-group of input data elements means that the input data elements in that sub-group (and only those input data elements) are used in the calculation of the output data element.

The "overlap" between two sub-groups refers to input data elements that are common to both sub-groups. It is not essential that all sub-groups overlap with one another. For example, it may be that only neighbouring output data elements depend on overlapping sub-groups. Also note that the overlap is preferably a partial overlap—whereby the sub-groups are different sub-groups, having some common input data elements, but not having all their input data elements in common.

The method may further comprise, for each subsequent layer after the first layer, writing the output data of the current layer to the one or more second memory devices (except that optionally, for the end layer, the output buffer may be configured to write the output data to the one or more first memory devices).

A cost of accessing the one or more second memory devices may be less than a cost of accessing the one or more first memory devices. The one or more first memory devices may be off-chip memory devices—for example, Synchronous Dynamic Random-Access Memory (SDRAM). The one or more second memory devices may be on-chip memory—for example, on-chip RAM. The cost of accessing the memory devices may be an energy cost and/or a time cost.

The method may further comprise, after reading the weight data from the one or more first memory devices, writing the weight data to the one or more second memory devices, the method optionally comprising, before evaluating each layer, reading the weight data for that layer from the one or more second memory devices.

The method may further comprise, for at least one layer of the plurality of layers: when calculating output data of the at least one layer: identifying a disposable portion of the output data of the at least one layer, which can be deleted after calculating the first block of output data; and identifying a non-disposable portion of the output data of the at least one layer, which should be retained after calculating the first block of output data, to be used for calculating at least one other block of output data, the method optionally comprising, when writing the output data of the at least one layer to the one or more second memory devices: writing the disposable portion to a first section of the one or more second memory devices; and writing the non-disposable portion to a second, different section of the one or more second memory devices.

Writing the disposable portion may comprise overwriting a disposable portion of the output data of a preceding layer that was previously written to the first section of the one or more second memory devices. Here, "previously" means previously in the course of calculating the first output block.

In this way, the disposable portion of the output data may be stored for a short period of time, in a first section of memory that is frequently overwritten. The non-disposable portion of the output data may be stored for a longer period of time in a second section of memory that is less frequently overwritten. This can facilitate efficient use of memory resources.

When evaluating a further layer of the plurality of layers, at least part of the disposable portion of the output data may be overwritten. The disposable portion may overwritten by a disposable portion of output data of said further layer.

The second section of the one or more second memory devices may be double buffered. This allows the non-disposable portion from a preceding block to be read from one memory location (one buffer), and allows the non-disposable portion from the current block to be written to a second memory location (second buffer), without overwriting data that is still needed for the calculations. For processing the next block, the memory locations used for reading and writing are switched.

The method may further comprise, when evaluating the subsequent layer to the at least one layer: reading the disposable portion from the first section of the one or more second memory devices; reading the non-disposable portion from the second section of the one or more second memory devices; and using the disposable portion and the non-disposable portion in the calculation of the output of said subsequent layer.

The method may further comprise: reading, from the one or more first memory devices, a second subset of the input data, representing a second block of the input data; processing the weight data and the second subset of the input data to evaluate each layer of the plurality of layers, and thereby calculate a second block of output data; and writing the second block of output data to the one or more first memory devices. The second block may be adjacent to the first block. It may extend in the same one or more dimensions as the first block.

The method may further comprise: reading, from the one or more first memory devices, a second subset of the input data, representing a second block of the input data; reading, from the one or more second memory devices, a non-disposable portion of output data from at least one of the plurality of layers, which was previously written to the one or more second memory devices during the calculation of the first block of output data; processing the weight data, the non-disposable portion, and the second subset of the input data to evaluate the plurality of layers, and thereby calculate a second block of output data; and writing the second block of output data to the one or more first memory devices.

The method may proceed, block by block, until all blocks of the output data have been calculated. If the end layer generates more than one output data set, corresponding blocks of output data for the other output data sets may be calculated in the same step as calculating each block of output data for the first output data set.

Processing the weight data and the first subset of the input data may comprise: processing the weight data and the first subset of the input data to evaluate the first layer of the plurality of layers, and thereby calculate output data of the first layer; and writing the output data of the first layer to the one or more second memory devices, to be read during the evaluation of the next subsequent layer of the plurality of layers.

Also provided is a hardware implementation of a neural network including a plurality of layers, the hardware implementation comprising:
one or more first memory devices, configured to store:
weight data representing weights for the plurality of layers; and
input data for the plurality of layers,
one or more second memory devices,
an input buffer, configured to obtain a first subset of the input data, representing a first block of the input data,
a coefficient buffer, configured to obtain the weight data,
one or more processing elements, configured to process the weight data and the first subset of the input data, to evaluate each layer of the plurality of layers and thereby calculate a first block of output data, and
an output buffer, configured to output the first block of output data,
wherein, to evaluate at least one layer subsequent to a first layer of the plurality of layers:
the input buffer is configured to read, from the one or more second memory devices, output data of a preceding layer;
the one or more processing elements are configured to process the weight data and the output data of the preceding layer to evaluate the at least one layer, and thereby calculate output data of the at least one layer; and
the output buffer is configured to write the output data of the at least one layer into the one or more second memory devices to be read during the evaluation of a subsequent layer. At least one of the plurality of layers is a convolutional layer.

In some examples, the input buffer may be configured to read the first subset of the input data directly from the one or more first memory devices. Alternatively, the one or more second memory devices may be configured to receive the first subset of the input data from the one or more first memory devices, and the input buffer may be configured to read this data from the one or more second memory devices. Similarly, in some examples, the coefficient buffer may be configured to read the weight data directly from the one or more first memory devices. Alternatively, the one or more second memory devices may be configured to receive the weight data from the one or more first memory devices, and the coefficient buffer may be configured to read the weight data from the one or more second memory devices. Likewise, in some examples, the output buffer may be configured to write the first block of output data directly to the one or more first memory devices. Alternatively, the output buffer may be configured to write the first block of output data to the one or more second memory devices, and the one or more first memory devices may be configured to receive the first block of output data from the one or more second memory devices. All combinations of these alternatives are hereby disclosed.

For each subsequent layer after the first layer, the output buffer may be configured to write the output data of the current layer to the one or more second memory devices (except that optionally, for the end layer of the plurality of layers, the output buffer may be configured to write the output data to the one or more first memory devices).

The one or more second memory devices may be configured to obtain the weight data from the one or more first memory devices, and the coefficient buffer may be configured to, before each layer is evaluated, read the weight data for that layer from the one or more second memory devices.

When output data of at least one layer of the plurality of layers has been calculated, the output buffer may be configured to: identify a disposable portion of the output data of the at least one layer, which can be deleted after calculating the first block of output data; identify a non-disposable portion of the output data of the at least one layer, which should be retained after calculating the first block of output data, to be used for calculating at least one other block of output data; and, optionally, write the disposable portion to a first section of the one or more second memory devices; and write the non-disposable portion to a second, different section of the one or more second memory devices.

When a further layer of the plurality of layers is evaluated, the output buffer may be configured to overwrite at least part of the disposable portion of the output data. The output buffer may be configured to overwrite the disposable portion by a disposable portion of output data of said further layer.

The second section of the one or more second memory devices may be double buffered.

When the subsequent layer to the at least one layer is evaluated: the input buffer may be configured to read the disposable portion from the first section of the one or more second memory devices; the input buffer may be configured to read the non-disposable portion from the second section of the one or more second memory devices; and the one or more processing elements may be configured to use the disposable portion and the non-disposable portion in the calculation of the output of said subsequent layer.

The input buffer may be configured to obtain a second subset of the input data, representing a second block of the input data; the one or more processing elements may be configured to process the weight data and the second subset of the input data to evaluate each layer of the plurality of layers, and thereby calculate a second block of output data; and the output buffer may be configured to output the second block of output data.

The input buffer may be configured to obtain a second subset of the input data, representing a second block of the input data; the input buffer may be configured to read, from the one or more second memory devices, a non-disposable portion of output data from at least one of the plurality of layers, which was previously written to the one or more second memory devices during the calculation of the first block of output data; the one or more processing elements may be configured to process the weight data, the non-disposable portion, and the second subset of the input data to evaluate the plurality of layers, and thereby calculate a second block of output data; and the output buffer may be configured to output the second block of output data.

The weight data optionally comprises one or more weight sets for each of the plurality of layers, and p depends on the number of weight sets for the end layer.

The one or more processing elements may be configured to process the weight data and the first subset of the input data to evaluate the first layer of the plurality of layers, and thereby calculate output data of the first layer; and the output buffer may be configured to write the output data of the first layer to the one or more second memory devices to be read during the evaluation of the next subsequent layer of the plurality of layers.

Also disclosed are: a processing system configured to perform a method as summarized above; and a processing system comprising a hardware implementation as summarized above. The processing system may be a graphics processing system or an artificial intelligence accelerator system. The processing system may be embodied in hardware on an integrated circuit.

Also provided is a method of manufacturing, using an integrated circuit manufacturing system, a hardware implementation as summarized above or a processing system as summarized above.

Also provided is a method of manufacturing, using an integrated circuit manufacturing system, a processing system as summarized above, the method comprising: processing, using a layout processing system, a computer readable description of the processing system so as to generate a circuit layout description of an integrated circuit embodying the processing system; and manufacturing, using an integrated circuit generation system, the processing system according to the circuit layout description.

Also provided is computer readable code configured to cause a method as summarized above to be performed when the code is run; and a computer readable storage medium having encoded thereon said computer readable code. The computer readable storage medium may be a non-transitory computer readable storage medium.

Further provided is an integrated circuit definition dataset that, when processed in an integrated circuit manufacturing system, configures the integrated circuit manufacturing system to manufacture a hardware implementation as summarized above or a processing system as summarized above.

Also provided is a computer readable storage medium having stored thereon a computer readable description of a processing system as summarized above that, when processed in an integrated circuit manufacturing system, causes the integrated circuit manufacturing system to manufacture an integrated circuit embodying the processing system.

Also provided is a computer readable storage medium having stored thereon a computer readable description of a processing system as summarized above which, when processed in an integrated circuit manufacturing system, causes the integrated circuit manufacturing system to: process, using a layout processing system, the computer readable description of the processing system so as to generate a circuit layout description of an integrated circuit embodying the processing system; and manufacture, using an integrated circuit generation system, the processing system according to the circuit layout description.

Also provided is an integrated circuit manufacturing system configured to manufacture a processing system as summarized above.

Also provided is an integrated circuit manufacturing system comprising: a non-transitory computer readable storage medium having stored thereon a computer readable description of a processing system as summarized above; a layout processing system configured to process the computer readable description so as to generate a circuit layout description of an integrated circuit embodying the processing system; and an integrated circuit generation system configured to manufacture the processing system according to the circuit layout description.

The layout processing system may be configured to determine positional information for logical components of a circuit derived from the integrated circuit description so as to generate a circuit layout description of an integrated circuit embodying the processing system.

The hardware implementation or processing system may be embodied in hardware on an integrated circuit. There may be provided a method of manufacturing, at an integrated circuit manufacturing system, a hardware implementation or processing system. There may be provided an integrated circuit definition dataset that, when processed in an integrated circuit manufacturing system, configures the system to manufacture a hardware implementation or processing system. There may be provided a non-transitory computer readable storage medium having stored thereon a computer readable description of a hardware implementation or processing system that, when processed in an integrated circuit manufacturing system, causes the integrated circuit manufacturing system to manufacture an integrated circuit embodying a hardware implementation or processing system.

There may be provided an integrated circuit manufacturing system comprising: a non-transitory computer readable storage medium having stored thereon a computer readable description of the hardware implementation or processing system; a layout processing system configured to process the computer readable description so as to generate a circuit layout description of an integrated circuit embodying the hardware implementation or processing system; and an integrated circuit generation system configured to manufacture the hardware implementation or processing system according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
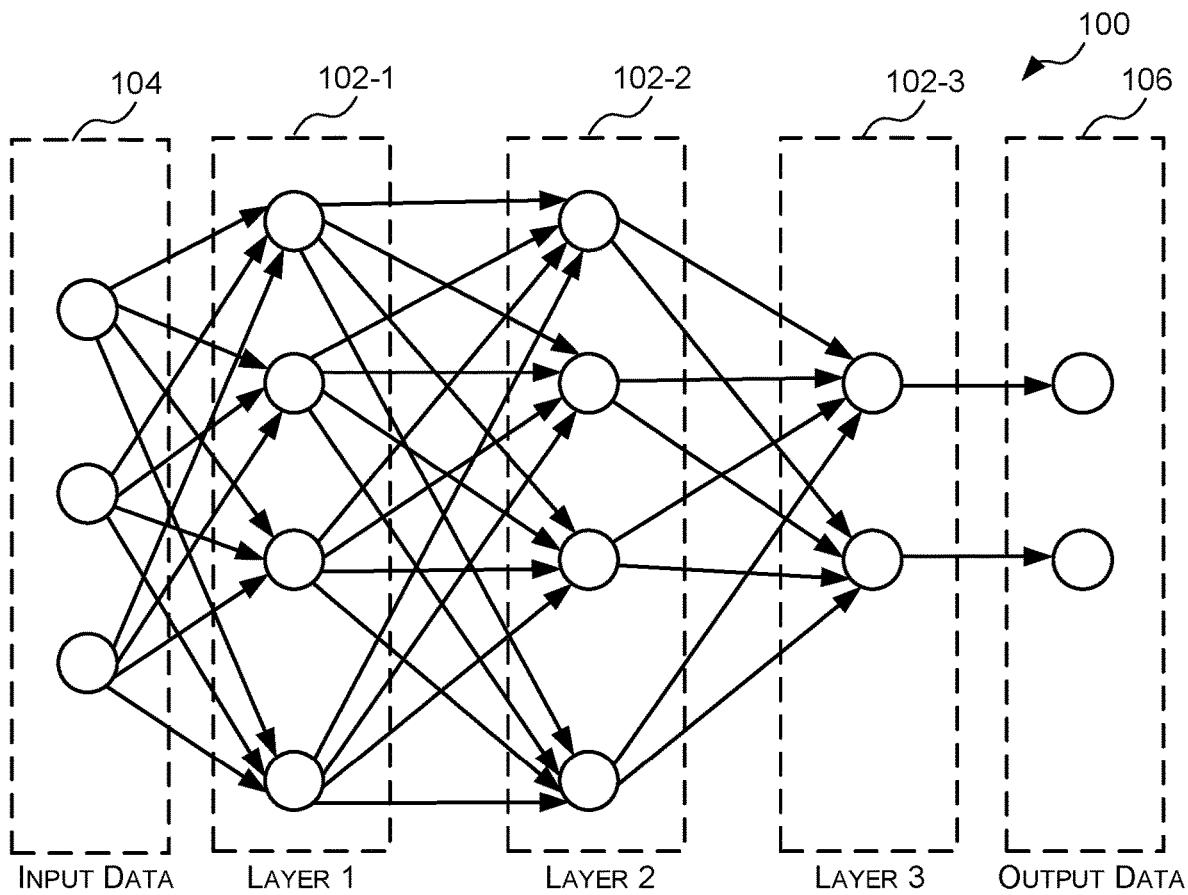
FIG. 1 is a schematic diagram of an example deep neural network (DNN)

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments will now be described by way of example only.

A Deep Neural Network (DNN) is a form of artificial neural network comprising a plurality of interconnected layers that can enable the DNN to perform signal processing tasks, including, but not limited to, computer vision tasks. FIG. 1 illustrates an example DNN 100 that comprises a plurality of layers 102-1, 102-2, 102-3. Each layer 102-1, 102-2, 102-3 receives input data, and processes the input data in accordance with the layer to produce output data. The output data is either provided to another layer as input data to that layer, or is output as the final output data of the DNN. For example, in the DNN 100 of FIG. 1 the first layer 102-1 receives the original input data 104 to the DNN 100 and processes the input data in accordance with the first layer 102-1 to produce output data. The output data of the first layer 102-1 becomes the input data to the second layer 102-2, which processes the input data in accordance with the second layer 102-2 to produce output data. The output data of the second layer 102-2 becomes the input data to the third layer 102-3, which processes the input data in accordance with the third layer 102-3 to produce output data. The output data of the third layer 102-3 is output as output data 106 of the DNN.

The processing that is performed on the input data to a layer depends on the type of layer. For example, each layer of a DNN may be one of a plurality of different types. Example DNN layer types include, but are not limited to: a convolution layer, an activation layer, a normalisation layer, a pooling layer and a fully connected layer. It will be evident to a person of skill in the art that these are example DNN layer types and that this is not an exhaustive list and there may be other DNN layer types.

A convolution layer is configured to convolve the input data using weights associated with that layer. Specifically, each convolution layer is associated with a plurality of weights $w_1 \ldots w_i$, which may also be referred to as filter weights or coefficients. The weights may be grouped to form or define one or more filters or kernels.

Figure 2:
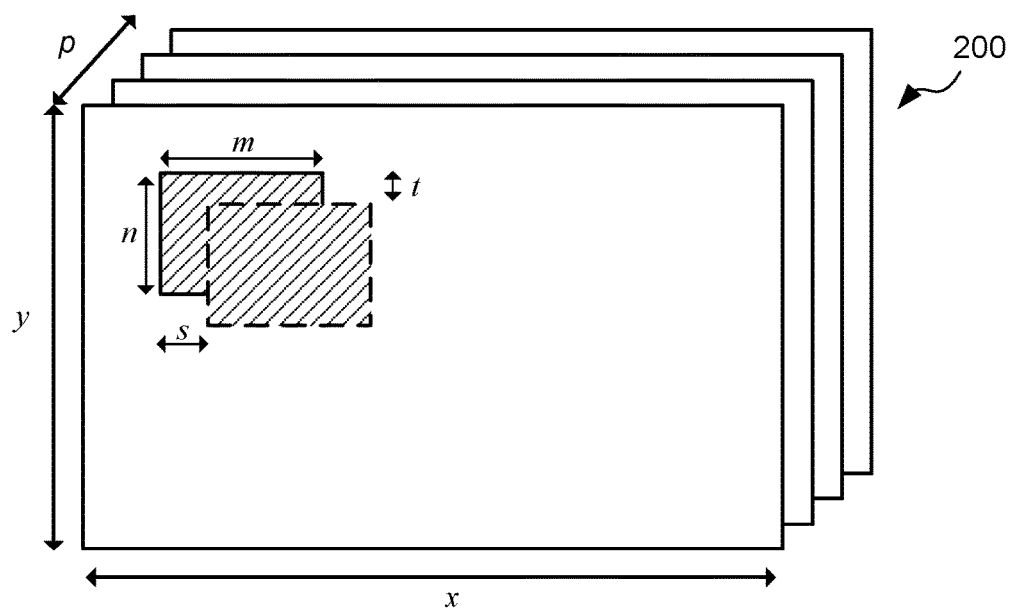
FIG. 2 is a schematic diagram of an example data in a DNN.

Reference is made to FIG. 2, which illustrates an example of the format of data 200 utilised in a DNN. As can be seen in FIG. 2, the data 200 used in the DNN may be arranged as p planes of data, where each plane has a dimension x×y. A DNN may comprise one or more convolution layers, each of which is associated with a plurality of filters, each of which comprises a plurality of weights. Each filter has a dimension m×n×p (that is, each filter comprises a set of m×n×p weights w) and is applied to the input data according to a convolution operation across several steps (known as strides) s and t, as illustrated in FIG. 2. The group of data elements to which the filter is applied at each stride is referred to as a window. Each filter produces one output plane. The number of filters and the number of weights per filter may vary between convolution layers. A convolutional neural network (CNN), which is a specific type of DNN that is effective for image recognition and classification, generally comprises a plurality of convolution layers.

A hardware implementation of a convolution layer may comprise a hardware module or block (which may be referred to herein as a "processing element") that is configured to calculate the sum of the products between the weights forming all or portion of a filter and input data values forming all or portion of a window (which may be referred to as a filter-window calculation). Since typically a high number of such filter-window calculations is performed, some hardware implementations may comprise a plurality of such processing elements so that more than one filter-window calculation can be performed in parallel. Preparing each processing element to perform a filter-window calculation involves reading the appropriate input data and weights for each filter-window calculation from memory and providing it to one of the processing elements. Typically, it is necessary to transfer a large amount of data from the memory to the processing elements. If this is not done efficiently, it can result in a high memory bandwidth requirement, and high-power consumption, for providing the input data and weights to the processing elements. This is particularly the case when the memory is "off-chip"—that is, implemented in a different integrated circuit or semiconductor die from the processing elements.

Accordingly, described herein are hardware implementations of neural networks, and methods for processing data in such hardware implementations, in which the input data and weights are provided to the processing elements in an efficient manner, to reduce the memory bandwidth required for, and power consumed by, providing the input data and weights to the processing elements. In particular, blocks of data are processed in a depth-wise manner, through a plurality of layers of the neural network. Intermediate outputs of the layers within the plurality of layers can be stored in one or more second memory devices. The one or more second memory devices may be smaller in size than the one or more first memory devices that are used for bulk storage of data, but may be quicker and/or more energy efficient to access. In one example, the one or more second memory devices are provided on-chip (that is, in the same integrated circuit or semiconductor die as the processing elements).

Figure 3:
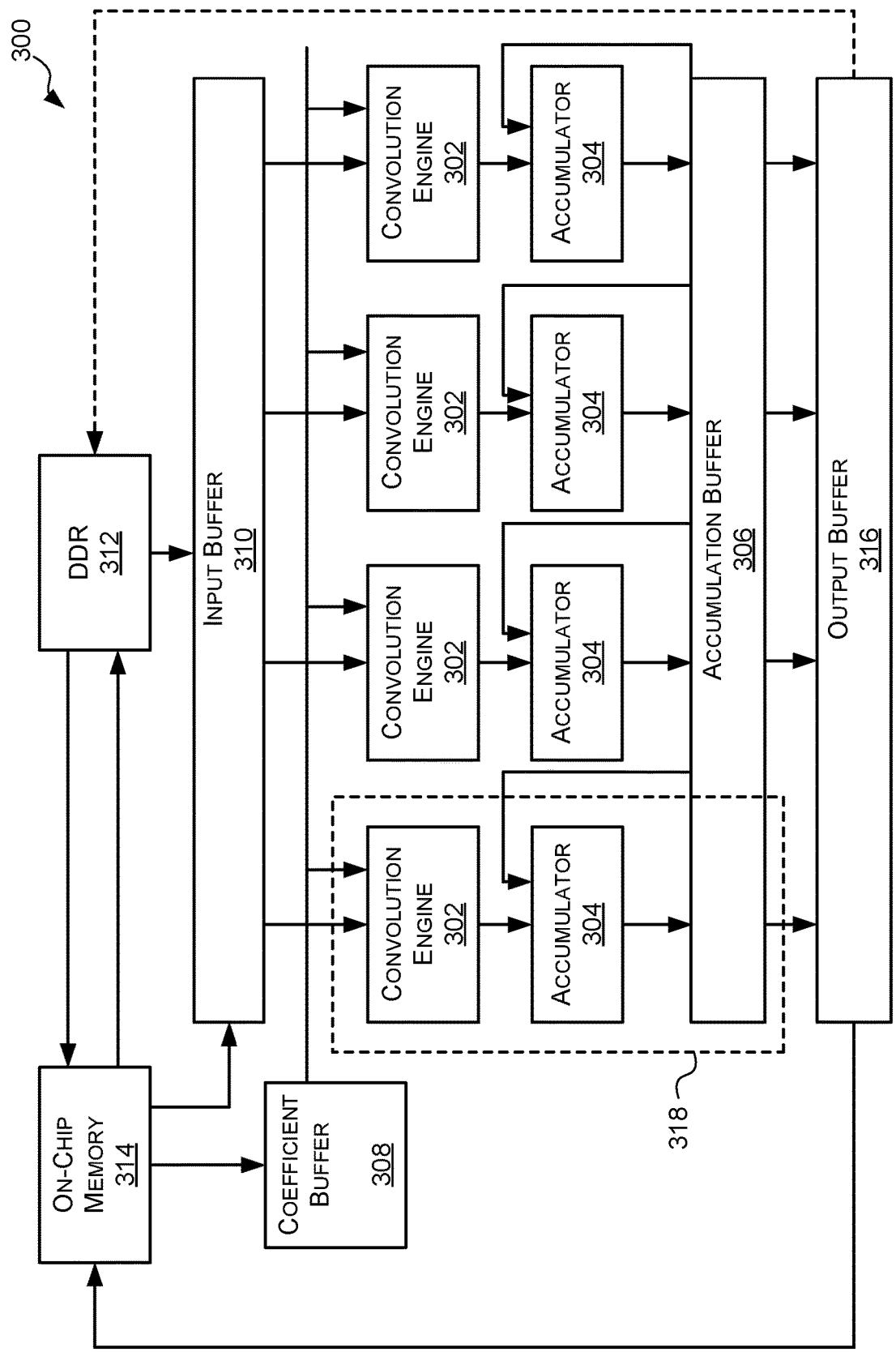
FIG. 3 is a block diagram of an example hardware implementation of a convolution layer of a DNN.

Reference is now made to FIG. 3, which illustrates an example hardware implementation 300 of a convolution layer of a DNN. The hardware implementation 300 comprises a plurality of convolution engines 302, a plurality of accumulators 304, an accumulation buffer 306, a coefficient buffer 308, and an input buffer 310. Each convolution engine 302, together with its respective accumulator 304 and its share of the resources of the accumulation buffer 306, represents a processing element 318. The hardware implementation further comprises a double data rate (DDR) SDRAM 312, which is an off-chip memory; an on-chip memory (OCM) 314, and an output buffer 316.

Figure 4:
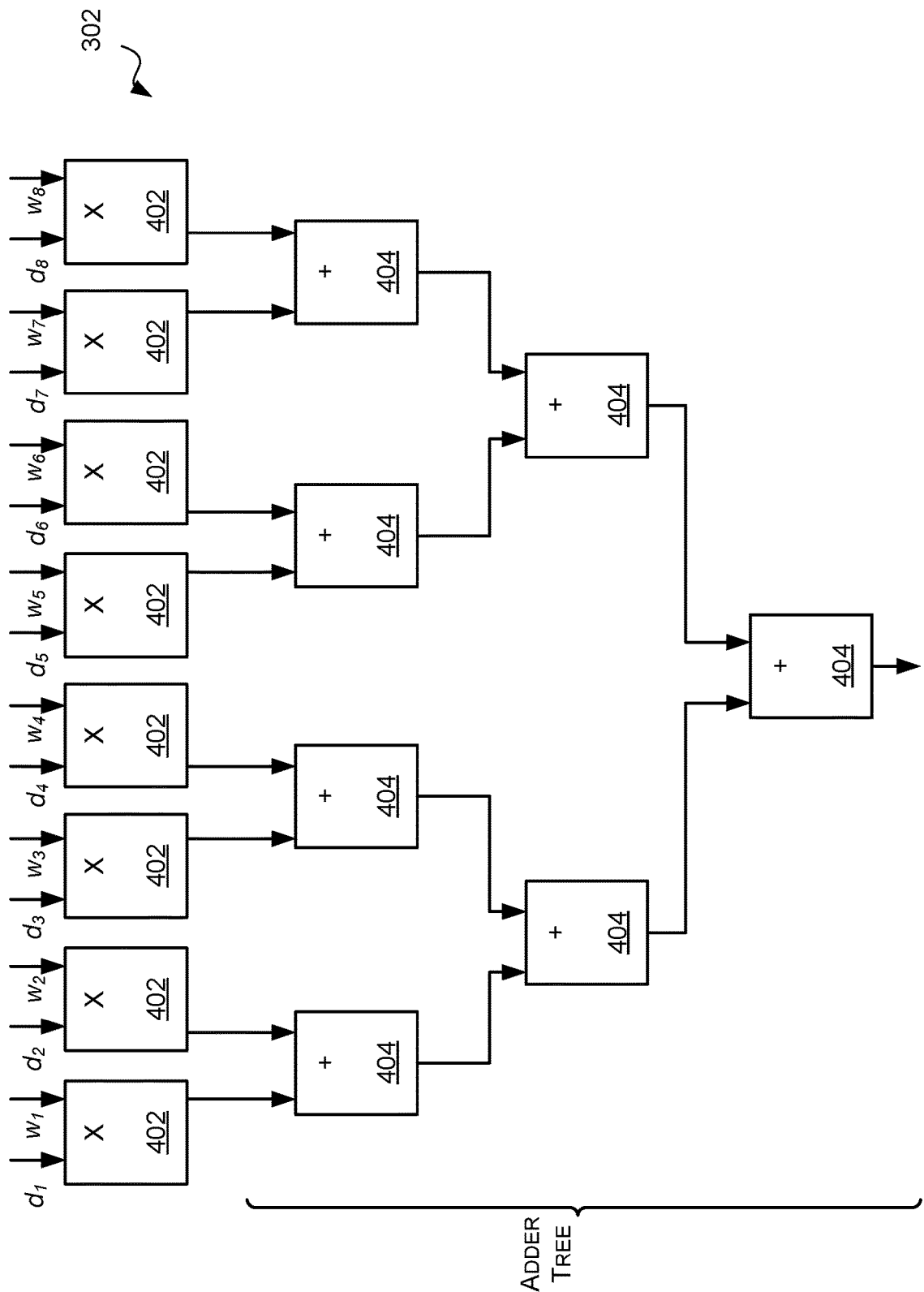
FIG. 4 is a block diagram of an example convolution engine of FIG. 3.

Each convolution engine 302 comprises hardware logic configured to receive a set of weights, e.g. $\{w_1 \ldots w_8\}$, that represent all or a portion of a filter, and a set of input data values, e.g. $\{d_1 \ldots d_8\}$, that represent all or a portion of a window, and perform a multiply-accumulate calculation on the received weights and input data values as depicted in FIG. 4. In some examples, as shown in FIG. 4, each convolution engine 302 may comprise a plurality of multipliers 402, each of which is configured to multiply a weight ($w_i$) and a corresponding input data value ($d_i$) to produce a multiplication output value. The multipliers 402 are followed by a plurality of adders 404 that form an adder tree to calculate the sum of the multiplication outputs. In the example of FIG. 4, the convolution engine 302 comprises eight multipliers 402, but in other examples there may be more or fewer multipliers. For example, in some cases there may be 128 multipliers. Generally, if there are Z multipliers 402 the adder tree comprises Z−1 adders 404.

In some cases, the multiply-accumulate calculation is pipelined. For example, the multipliers 402 and adders 404 may be divided into a number of pipeline stages with a register stage (not shown) before the first pipeline stage and between each pair of pipeline stages. For example, the multipliers may form a first pipeline stage and the adders may be divided into layers wherein the subsequent pipeline stages comprise one or more layers of adders.

The example hardware implementation 300 of FIG. 3 comprises four convolution engines 302; however, it will be evident to a person of skill in the art that the methods and principles described herein are applicable to hardware implementations with any number of convolution engines.

Since it may take more than one hardware pass of a convolution engine to generate a complete filter result (e.g. because a convolution engine may only receive and process a portion of the weights of a filter and/or a portion of the input data values of a window in a cycle) the hardware implementation may comprise a plurality of accumulators 304. Each accumulator 304 receives the output of one convolution engine 302 and adds the output to the previous convolution engine output that relates to the same filter. Since the convolution engine may not generate or produce outputs that relate to the same filter in consecutive cycles the partial results of one or more filters may be stored in an accumulation buffer 306 and then the appropriate partial result may be provided to the accumulator each cycle by the accumulation buffer 306. In some examples, the accumulation buffer 306 may be able to store partial results related to 128 different filters.

The coefficient buffer 308 comprises memory (not shown) to store a plurality of weights related to a convolution layer (or fully connected layer) of the DNN and hardware logic (not shown) to provide the weights to the convolution engines 302 for processing in a predetermined order over a plurality of cycles. The plurality of weights may comprise all of the weights related to the convolution layer or only a portion of the weights related to a convolution layer. Although the coefficient buffer 308 is shown as a single module, the coefficient buffer 308 may be implemented by a plurality of coefficient buffers that each form a bank, for example.

The input buffer 310 comprises memory (not shown) to store a plurality of input data values related to a convolution layer (or fully connected layer) of the DNN and hardware logic (not shown) to provide the input data values to the convolution engines 302 for processing in a predetermined order over a plurality of cycles. The plurality of input data values may comprise all of the input data values related to the convolution layer or only a portion of the input data values related to a convolution layer. Although the input buffer 310 is shown in FIG. 3 as a single module, the input buffer 310 may be implemented by a plurality of input buffers that each form a bank, for example.

The DDR 312 is coupled to the on-chip memory 314, for providing weight data to the on-chip memory 314. The DDR 312 is also coupled to the input buffer 310, for providing blocks of input data to the input buffer 310. The on-chip memory 314 is coupled to the coefficient buffer 308, for providing weight data to the coefficient buffer 308. The on-chip memory 314 is also coupled to the input buffer 310, for providing intermediate output data (which comprises input data to subsequent layers) to the input buffer 310. The on-chip memory 314 is also coupled to the DDR 312, for providing blocks of output data of the end layer of the plurality of layers to the DDR 312. The accumulation buffer 306 is coupled to the output buffer 316, to allow the output buffer to receive intermediate output data of the layers within the plurality of layers, as well as the output data of the end layer. The output buffer 316 is coupled to the on-chip memory 314, for providing the intermediate output data and output data of the end layer to the on-chip memory 314.

The various connections are shown separately in the example of FIG. 3; but, in some embodiments, some or all of them may be provided by one or more shared bus connections. It should also be understood that other connections may be provided, as an alternative to or in addition to those illustrated in FIG. 3. For example, the output buffer 316 may be coupled to the DDR 312, for providing output data directly to the DDR 312. As a further example, the DDR 312 may be coupled to the coefficient buffer 308, for providing weight data directly to the coefficient buffer 308. Likewise, in some cases, not all of the connections illustrated in FIG. 3 are necessary. For example, the DDR 312 need not always be coupled to the input buffer 310—the input buffer could alternatively obtain input data from the DDR 312 via the on-chip memory 314.

Figure 5:
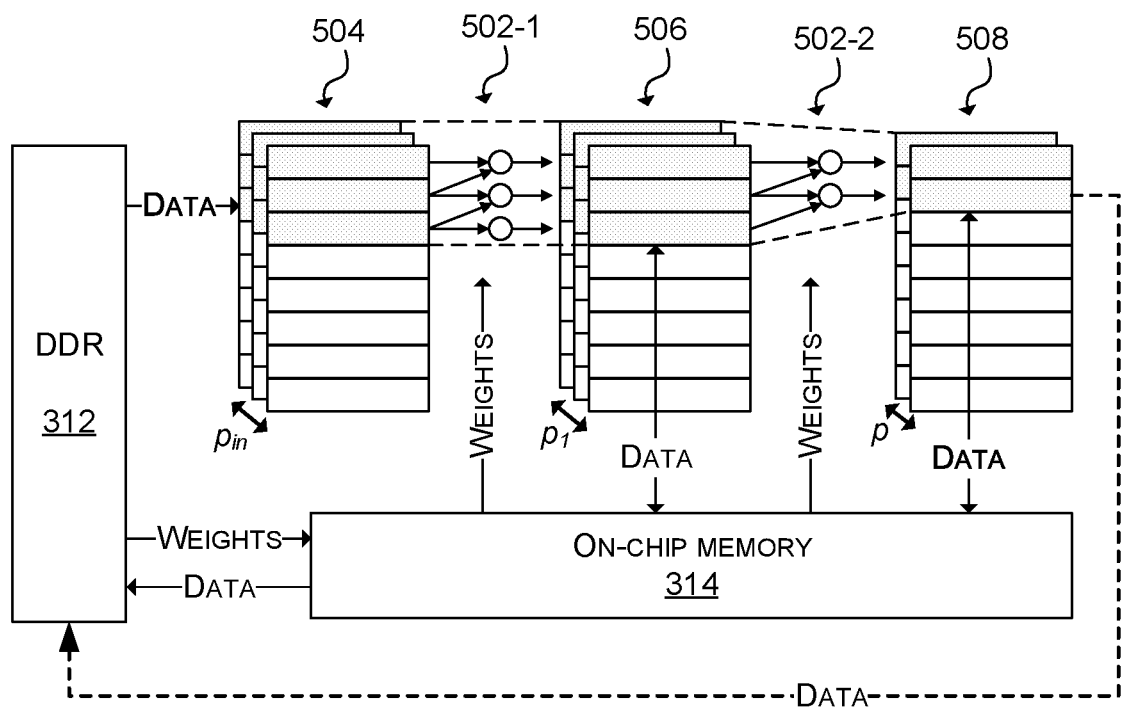
FIG. 5 is a schematic diagram illustrating a flow of data according to an example hardware implementation.

FIG. 5 is a simplified schematic diagram, to better illustrate the flow of data according to one example of a hardware implementation like that of FIG. 3. FIG. 5 shows a plurality of layers (consisting of two layers 502-1, 502-2) of a neural network. These may be any two successive layers of the network. Note also that the plurality of layers is not limited to two layers. The diagram shows the input data 504 to the first layer 502-1 of the plurality of layers. The intermediate output data 506 of the first layer 502-1 forms the input data to the second layer 502-2 (which is the end layer in this two-layer example). The diagram also shows the output data 508 of the second layer 502-2 (end layer). The DDR 312 is a first memory device, with a relatively high cost of reading/writing. The on-chip memory 314 is a second memory device, with a relatively lower cost of reading/writing. For example, it may take more energy to read/write a given amount of data from/to the DDR than from/to the on-chip memory 314. It will be appreciated that DDR memory is just one example of a bulk memory storage device, and other memory/storage technologies can also be used, such as flash memory.

According to the example of FIG. 3 and FIG. 5, the DDR 312 stores input data for the first layer 502-1 of the plurality of layers 502-1, 502-2. The DDR 312 also stores weight data representing weights for the plurality of layers 502-1, 502-2. In the present example, the weight data is transferred from the DDR 312 to the on-chip memory 314. The coefficient buffer 308 reads the weight data from the on-chip memory 314 and provides the weight data to the processing elements 318. The input buffer 310 reads, from the DDR 312, a first subset of the input data, representing a first block of the input data 504. This first subset of the input data 504 is shown shaded in grey in FIG. 5 and may comprise one or more planes of data. The input buffer 310 provides the first subset of input data 504 to the processing elements 318. The processing elements 318 process the weight data and the first subset of the input data 504 to evaluate each layer of the plurality of layers and thereby calculate a first block of output data 508 for the end layer. This first block of output data 508 is shown shaded in grey in FIG. 5 and may comprise one or more planes of data. The output buffer 316 may write the first block of output data 508 to the on-chip memory 314. From there, the first block of output data 508 may be transferred to the DDR 312. Alternatively, the output buffer may write the output data directly into the DDR memory 312 (as indicated by the dashed arrow in FIGS. 3 and 5).

As indicated in FIG. 5, the data input to and output from each layer is arranged in one or more planes (also referred to herein as input and output data sets). In the example illustrated in FIG. 5, the input data 504 comprises $p_{in}=3$ planes of data. The intermediate output data 506 of the first layer 502-1 comprises $p_1=3$ planes of data. The output data 508 of the second layer 502-2 comprises $p=2$ planes of data. The number of planes depends on the weight data. In particular, the weights making up each filter take a predetermined number of input planes as input data, and each filter outputs a plane of output data. The number of planes of data produced by a given layer is thus equal to the number of filters applied by that layer. Each plane of data may represent a feature map. In the example of FIG. 5, the three planes of input data 504 might represent three feature maps generated by an earlier layer of the neural network (if the first layer 502-1 in the drawing is not the first layer of the neural network). Alternatively (if the first layer 502-1 is the first layer of the neural network), the three planes of input data 504 may represent three planes of input data. Input data having multiple planes arises frequently in image-processing tasks, for example. Such input planes may include but are not limited to: Red, Green, and Blue (RGB) planes; or Hue, Saturation, and Value (HSV) planes. The input planes could also include depth data as one of the input planes.

In order to calculate the first block of output data, the processing elements 318 must evaluate each layer of the plurality of layers (as mentioned above). In particular, the coefficient buffer 308 reads the weight data for the first layer 502-1 from the on-chip memory 314. The processing elements 318 process the weight data for the first layer 502-1 and the first subset of the input data 504 to evaluate the first layer 502-1 of the plurality of layers, and thereby calculate output data 506 of the first layer. This is a block of output data of the first layer 502-1 corresponding to the first block of input data 504. In other words, it is a subset of the complete set of output data of the neural network for the first layer 502-1. This block/subset is shaded in grey in FIG. 5. The output buffer 316 writes the block of output data of the first layer 502-1 to the on-chip memory 314. It represents intermediate output data that will be needed as input data to the next layer (second layer 502-2). In order to evaluate the next layer (second layer 502-2), the input buffer 310 reads, from the on-chip memory 314, the block of the output data 506 of the first layer 502-1 that was stored there by the output buffer 316. The coefficient buffer 308 reads the weight data for the second layer 502-2 from the on-chip memory 314. The processing elements 318 process the weight data for the second layer 502-2 and the block of the output data 506 of the preceding (first) layer, to evaluate the second layer 502-2 and thereby calculate output data of the second layer 502-2. This procedure continues for any subsequent internal layers of the plurality of layers—saving the intermediate output data in the on-chip memory 314 each time, and reading this intermediate output data to provide the input data to the next layer. This continues until the end layer is reached. In the example of FIG. 5, the second layer 502-2 is the end layer. The output of the second layer 502-2 is therefore the first block of the output data 508. As explained already above, the output buffer 316 may write the first block of output data 508 to the on-chip memory 314. From there, the first block of output data 508 may be transferred to the DDR 312. Alternatively, the output buffer 316 may write the output data directly to the DDR 312 (dashed arrow).

Processing a subset or block of input data through multiple layers of the neural network, in this way, can efficiently utilise the processing resources of the processing elements 318. Writing the intermediate output data to the on-chip memory 314 and reading it from the on-chip memory 314 to process the next layer reduces the need to read and write data from the off-chip DDR 312, which can help to reduce power consumption. Note that the on-chip memory 314 can be significantly smaller than the off-chip DDR 312, because the on-chip memory 314 only needs to store data associated with the current block of input data, the current block of output data, and the associated blocks of intermediate output data for the internal layers, during each pass. This contrasts with the conventional approach to evaluating layers of a neural network, whereby each layer is processed independently in its entirety and the memory needs to be able to store the entire input data and entire output data of a layer at any given time. This requires a much larger memory, which is typically impractical to implement as on-chip memory. Consequently, the conventional approach in practice requires the use of off-chip memory to store the intermediate output data. Since off-chip read- and write-operations typically consume much more energy than on-chip read- and write-operations, reducing the amount of data written to the off-chip memory can result in significant savings in power consumption.

The size of the block to be processed in each pass can be chosen based on the available storage capacity of the on-chip memory 314, the number of layers in the plurality of layers, and the structure of the neural network. An example approach for memory management in the on-chip memory 314 will be described below. First, it is useful to consider how a block of output data of a plurality of layers in a neural network depends on intermediate output data of the preceding layers and input data for the first layer. This can be understood with reference to FIG. 6. This shows the input data to three layers (not shown explicitly) of a neural network; the output data of the first layer (here labelled as layer 0); the output data of the second layer (labelled layer 1); and the output data of the end layer. For simplicity, it is convenient to think of the output data of the end layer as a single feature map created by a single filter. Likewise, the other layers may be thought of as convolutional layers, with a single filter, creating a single output feature map, as shown in simplified form in the drawings. Of course, the scope of the present disclosure is not limited in this way—these are simplifications purely for ease of understanding. At each layer, a single filter could be applied to multiple input channels (feature maps), or multiple filters could be applied to one input channel or multiple input channels, thereby processing and/or generating multiple planes of data. Methods and hardware implementations according to the present disclosure can be used equally in such scenarios.

Starting from a first block of output data ($Tile_1$) in the end layer, it is possible to trace backwards through the network to find the intermediate data and input data upon which this output block depends. There is a block of data ($Tile_1$) in the layer 1 output that corresponds to $Tile_1$ in the end layer, in the sense that $Tile_1$ in layer 1 is needed to calculate $Tile_1$ in the end layer. Let us assume that the filter has a kernel size greater than 1. Because of this kernel size, $Tile_1$ in the layer 1 output is larger than $Tile_1$ in the end layer output. In other words, $Tile_1$ in the end layer output depends on some additional data in the layer 1 output. For example, for a 3×3 kernel and a stride of 1, one extra row of output data is needed in the layer 1 output. This expansion in the amount of data required is indicated by the sloped dashed line in FIG. 6. Each Tile is delimited by solid lines, in this drawing.

Next, we consider which data in the layer 0 output is necessary to calculate $Tile_1$ in the layer 1 output. We will assume, for the sake of variety, that the stride in layer 1 is greater than 1. This means that the layer 1 output is smaller than the layer 0 output. There is a block, $Tile_1$, in layer 0, which corresponds to $Tile_1$ in layer 1. Since the kernel size is again greater than 1; there is a further growth in the amount of data required at the boundary. $Tile_1$ in the layer 0 output is therefore larger than $Tile_1$ in the layer 1 output.

The same happens when looking back from layer 0 to the input data. There is a block, $Tile_1$, in the input data, corresponding to $Tile_1$ in layer 0. We assume that the stride in layer 0 is 1; therefore, the input data is approximately the same size as the layer 0 output (subject to padding). Again, additional data needed at the boundary, due to the kernel size being greater than 1. Thus, $Tile_1$ in the input data is larger again than $Tile_1$ in the layer 0 output. $Tile_1$ in the input data makes up the first subset (block 1) of input data. $Tile_1$ in the output data of the end layer makes up the output block.

Figure 6:
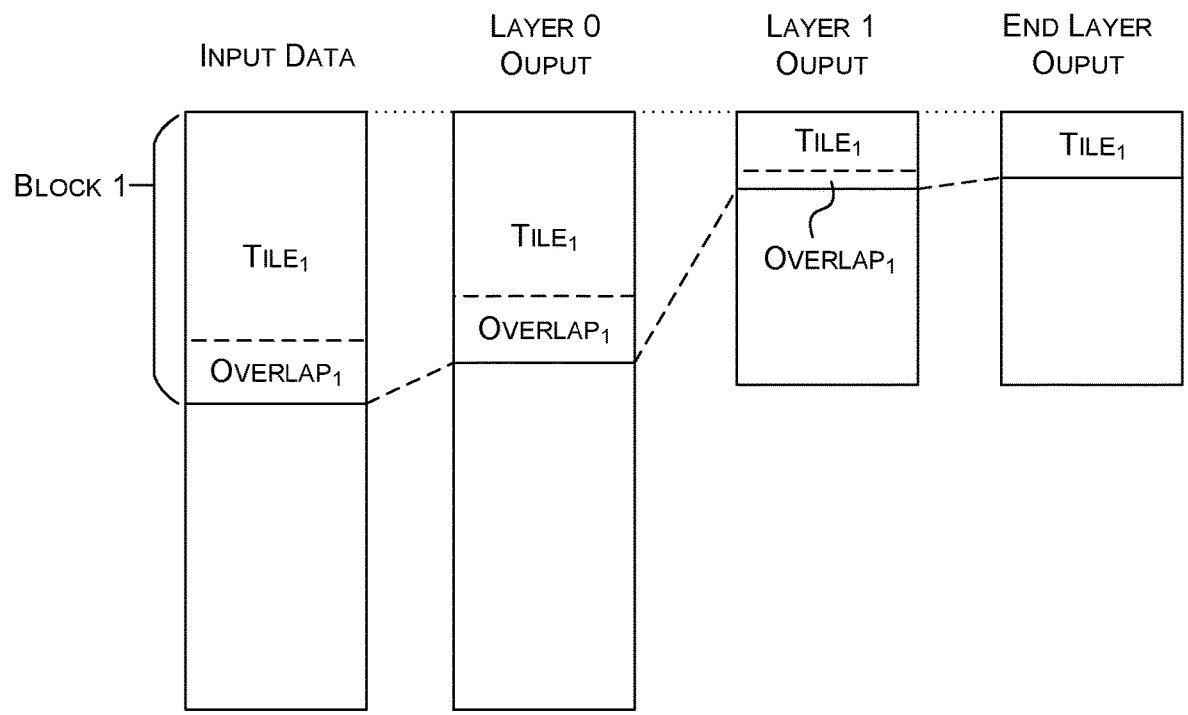
FIG. 6 illustrates the data dependency within a plurality of layers of a DNN, for a first block of data.

As can be deduced from the above, the total amount of data needed for the first tile grows successively from the end block back to the input block. It depends on the parameters (kernel size, stride, dilation) of all the intervening layers. Also indicated in FIG. 6 is the "Overlap". This is data that can be reused in a subsequent pass—that is, reused when calculating a subsequent Tile. The Overlap data is indicated by the dashed horizontal lines in each layer of data. $Overlap_1$ in the layer 1 output is the portion of $Tile_1$ that can be (re)used in calculating a subsequent block ($Tile_2$) of the end layer output. $Overlap_1$ in the layer 0 output is the portion of $Tile_1$ that can be (re)used in calculating $Tile_2$ of the layer 1 output. The size of the Overlap depends on the parameters (kernel size, dilation) of the next layer only. For example, if the stride=1 and dilation=1, the size of the Overlap (number of rows of Overlap) is given by the kernel size minus 1.

Figure 7:
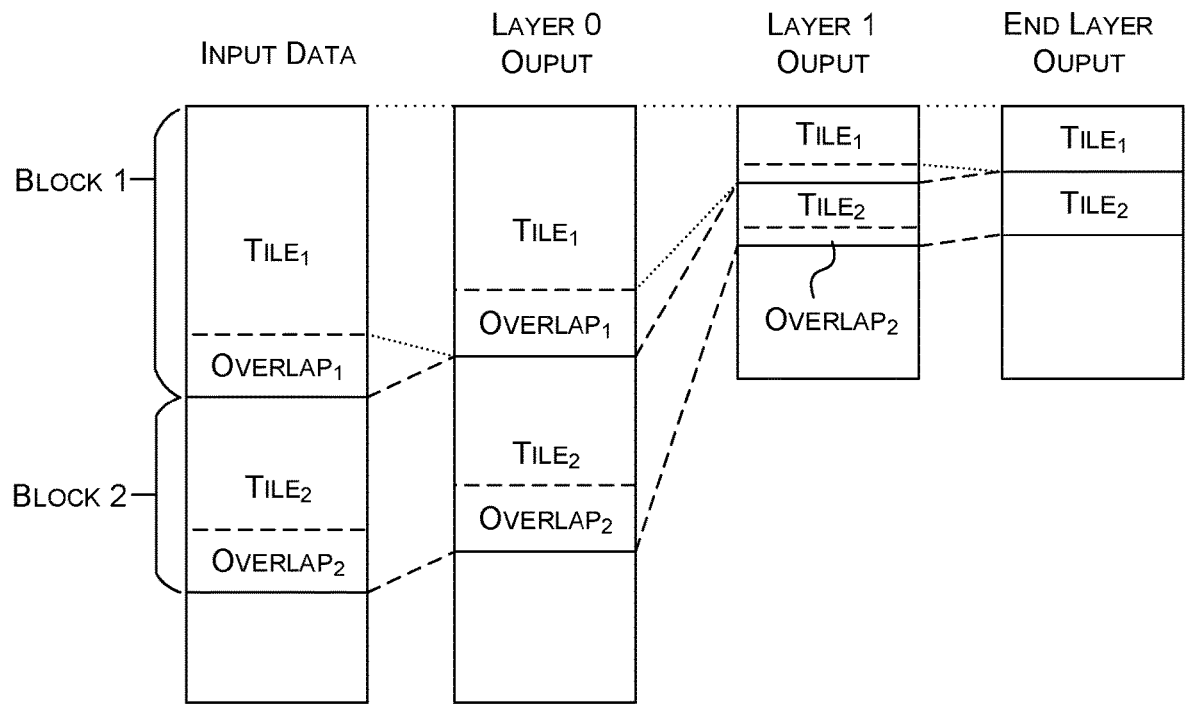
FIG. 7 illustrates the data dependency within the plurality of layers of FIG. 6, for a second block of data.

Following on from FIG. 6, FIG. 7 illustrates the data dependency for a second block. The second block ($Tile_2$) of output data of the end layer, is adjacent to the first block ($Tile_1$). Just like $Tile_1$, $Tile_2$ depends on amounts of intermediate data (and ultimately input data) that increase as we progress backwards through the layers. However, some of this data is common with the dependency of $Tile_1$ in the output data of the end layer. In particular, $Overlap_1$ in the output of layer 1 has already been calculated when evaluating layer 1 for Block 1 ($Tile_1$). The only additional data that needs to be calculated is the block $Tile_2$ in layer 1. Likewise, moving backwards to the layer 0 output, the only additional data that needs to be calculated is the block $Tile_2$ in layer 0. Finally, moving backwards to the input data, the only additional input data that needs to be read from memory is Block 2 ($Tile_2$). As in FIG. 6, each Tile in FIG. 7 is delimited by solid lines. The Overlap data is delimited by dashed lines. The dotted lines indicate the uppermost extremity of the data dependency (that is, the first row of data needed to calculate the Tile in the next layer). The sloped dashed lines indicate the lowermost extremity of the data dependency (that is the last row of data needed to calculate the Tile in the next layer). Thus, for example, $Tile_2$ in the layer 1 output depends on Overlaps and $Tile_2$ in the layer 0 output. $Tile_2$ incorporates $Overlap_2$, which will be reused in the next pass to calculate $Tile_3$ of the subsequent layer, and so on. Note that, provided the Overlap data from the first pass is retained, the amount of "fresh" data needed for $Tile_2$ does not increase as we step backwards through the layers (except to the extent dictated by strides greater than 1). The same is true for all subsequent passes (Tiles), after $Tile_2$. In other words, for all passes after the first pass (first Tile), a smaller amount of input data needs to be retrieved from memory, and smaller amounts of intermediate data need to be calculated at each layer.

This leads us to an important observation: the Overlap data constitutes a non-disposable portion of the data. The remainder of each Tile constitutes a disposable portion of the data. By this, we mean that the Overlap data is needed not only for calculating output data for the end layer for the current block but will also be needed later, for calculating output data for the end layer for a subsequent block (subsequent Tile). In contrast, the remainder of the data in each Tile is needed for calculating output data for the end layer for a current block, but it can be deleted/overwritten after that.

Figure 8:
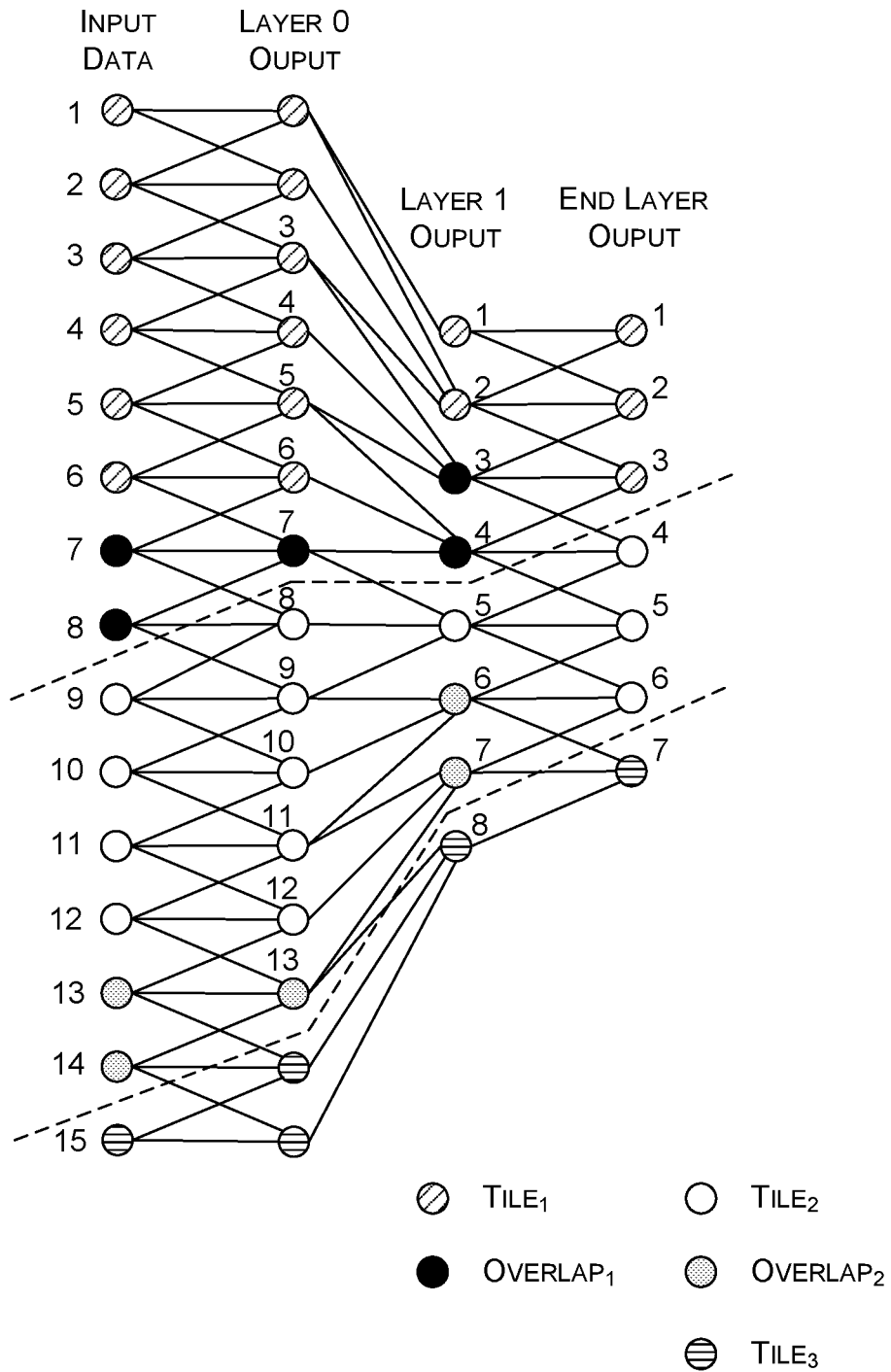
FIG. 8 is a conceptual illustration of the concept of overlap-data.

To consider this in detail for a simplified one-dimensional example, reference is made to FIG. 8. The diagram in FIG. 8 illustrates individual data elements in the input data and the output data of each of three layers of a neural network (layer 0, layer 1, and an end layer). Each circle represents a data element (which could be, for example, a pixel in an image or feature map). Each element depends on a certain sub-group of elements in the preceding layer. The connecting lines in FIG. 8 indicate the elements of the preceding layer upon which a given element depends. Thus, for example, the $3^{rd}$ element in the output of the end layer depends on the $2^{nd}$, $3^{rd}$ and $4^{th}$ elements in the output of layer 1. The fourth element in the output of the end layer depends on the $3^{rd}$, $4^{th}$, and $5^{th}$ elements in the layer 1 output. In other words, in this example, the end layer has a kernel size of 3 and a stride of 1. Layer 1 has a kernel size of 3 and a stride of 2. Layer 0 has a kernel size of 3 and a stride of 1. Because layer 0 and the end layer each have a stride of 1, the output of layer 0 is approximately the same size as the input data, and the output of the end layer is approximately the same size as the output of layer 1 (subject to the need for padding). Meanwhile, because layer 1 has a stride of 2, the output of layer 1 is approximately half the size of the output of layer 0. The dashed lines represent the boundaries between blocks (Tiles). That is, the 3rd data element shown in the end layer is the final data element of the first block ($Tile_1$). Taking the 4th element in the end layer output as an example, it can be seen that each element in the end layer output depends on: 3 elements in the output of layer 1; 7 elements in the output of layer 0; and 9 elements in the input data. Elements in $Tile_1$, other than the $Overlap_1$ elements, are shown with diagonal hatching. Three such elements (1-3) are shown, by way of example, in the end layer output.

Because of the data dependency, some elements can be discarded after the end layer output for the current block ($Tile_1$) has been calculated. These are referred to as "disposable" elements. Some other elements will be used also for calculating the end layer output for the next block ($Tile_2$). These are referred to as "non-disposable" elements. In particular, the $Overlap_1$ elements (coloured solid black in FIG. 8) are non-disposable elements. Elements 7 and 8 in the input data are used to calculate elements 6 and 7 in the output of layer 0, during the first pass through the plurality of layers, to calculate the end layer output data for the current block ($Tile_1$). However, they are also needed to calculate elements 8 and 9 in the layer 0 output. These elements 8 and 9 are not needed in the first pass for calculating the first block, but they will be needed in the second pass for calculating the second block. Consequently, to minimise memory access overhead, it is desirable to retain elements 7 and 8 of the input data in the on-chip memory 314, to avoid the need to read them again from the DDR 312 in the second pass. Element 7 in the layer 0 output and elements 3 and 4 in the layer 1 output are also Overlaps elements, since they will also be needed for calculations in the second pass (element 7 in the layer 0 output will be needed to calculate element 5 in the layer 1 output; and elements 3 and 4 in the layer 1 output will be needed to calculate elements 4 and 5 in the end layer output).

Now consider the remaining elements of $Tile_1$, shown with diagonal hatching in FIG. 8. Element 6 of the input data is used in the calculation of elements 5, 6, and 7 of the layer 0 output. However, each of these three elements must be calculated in the first pass, for calculating the first output block ($Tile_1$). Element 6 of the input data is not needed for any additional calculations in the second pass; therefore, it is "disposable" data. Similarly, element 6 in the layer 0 output is used to calculate element 4 in the layer 1 output, but is not needed further in the second pass (provided that element 4 in the layer 1 output is retained).

Elements of $Tile_2$ (other than the $Overlap_2$ elements) are shown as empty circles. $Overlap_2$ elements are shown shaded in grey. These will be reused in the calculation of $Tile_3$ and are therefore non-disposable data. A few $Tile_3$ elements are shown at the bottom of the drawing, with horizontal hatching.

The present inventors have recognised that the disposable data, is only required for calculating the next layer, in the present pass through the plurality of layers. Once the next layer in the present pass has been calculated, the disposable data from the preceding layer can be deleted/overwritten. The non-disposable data (Overlap) must be retained, for all layers of the present pass, in order that it can be used in the second pass, for calculation of the second block. This recognition can enable a reduction in unnecessary read/write operations from/to the DDR 314, and also a reduction in unnecessary re-calculation of intermediate output data.

Figure 9:
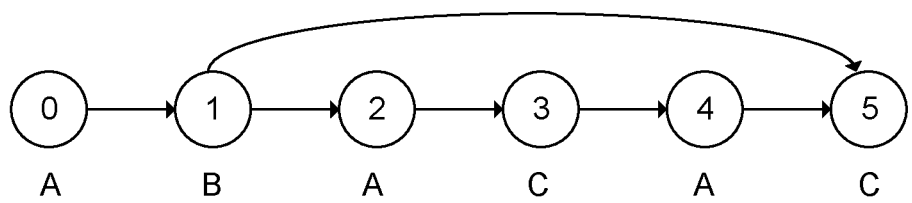
FIG. 9 schematically illustrates an example allocation of memory associated with a hardware implementation of a DNN.
Figure 9:
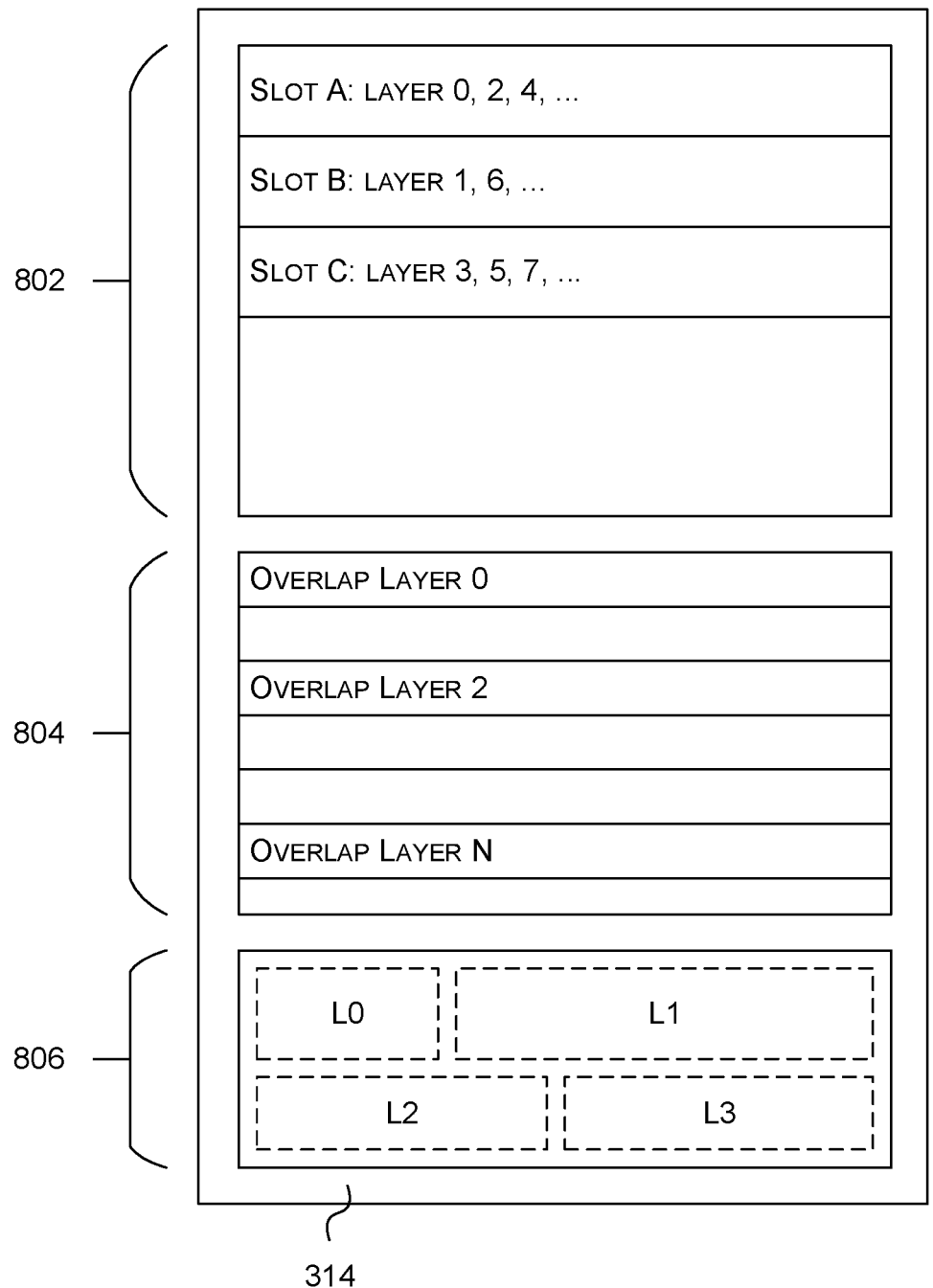

A memory management strategy according to one example of the hardware implementation will now be explained with reference to FIG. 9. The inventors have recognised that the disposable data is relatively large, but valid for a short period of time. Conversely, the non-disposable data (Overlap) is relatively small, but valid for the whole pass. FIG. 9 illustrates one example memory allocation for the on-chip memory 314 that exploits these characteristics. In this example, we assume that six layers (numbered 0, 1, 2, 3, 4, 5) of a neural network are to be processed together. Each layer is connected to its preceding layer, in one branch. In a second branch, layer 5 is connected to layer 1. This means that the output data of layer 1 is part of the input data to layer 5.

The memory management strategy divides the on-chip memory 314 into three sections. The first section 802 (which may be referred to as "swap" memory) is used for storing the disposable data. The second section 804 (which may be referred to as "heap" memory) is used for storing the non-disposable data. The third section 806 (coefficient memory) is used for storing the weight data for the various layers. Within the first section 802, a plurality of slots A, B, C are defined. Within a given pass (to calculate a given block of output data) the method proceeds as follows. The disposable output of layer 0 is written to slot A. The non-disposable output of layer 0 is written to the start of the second section 804. Before evaluating layer 1, the data is read from these two locations. During the evaluation of layer 1, the disposable output of layer 1 is written to slot B and the non-disposable output of layer 1 is written to the second section 804—for example, appended to the non-disposable output of layer 0. At this point, the disposable data from layer 0 is no longer needed. Consequently, during the evaluation of layer 2, the contents of slot A can be overwritten with the disposable output of layer 2. The non-disposable output of layer 2 is once again appended to the data in the second section 804. However, when evaluating layer 3, neither slot B nor slot A should be overwritten. The contents of slot B (disposable output of layer 1) are needed again for the evaluation of layer 5, because of the branching. And, of course, the contents of slot A are needed immediately for the evaluation of the current layer (layer 3). Accordingly, the disposable output of layer 3 is written to slot C. The disposable output of layer 4 is written to slot A, once again overwriting the contents of that slot, which are no longer needed for further calculations. In order to evaluate layer 5, the disposable output data from layer 1 is read from slot B, and the disposable output data from layer 4 is read from slot A. (The non-disposable output data from layers 1 and 4 is read from the second section 804.)

In this way, the slots used to store the disposable data are reused frequently within a given pass, thereby helping to reduce the total amount of the on-chip memory 314 that is occupied at any given instant. The size of each slot can be chosen based on the maximum size of disposable data to be stored in that slot during a pass. Note that the second section 804 is double buffered, in this example. The non-disposable output data (Overlap) for all layers of the current block is stored in one set of memory locations. In the next pass (to calculate the next block), the Overlap is retrieved from this set of memory locations, as needed. The Overlap for the next block is stored in a second set of memory locations. For subsequent passes (subsequent blocks) the hardware implementation alternates between using the first set and the second set of memory locations—reading from one set while writing to the other set.

The disposable and non-disposable portions of the data can be identified by analysing the structure of each layer of the plurality of layers. Similarly, the allocation of the disposable data of each layer to a particular slot in the first section 802 of the on-chip memory 314 can be done by analysing the overall layer structure of the plurality of layers. This analysis can be conducted by software, either dynamically at runtime or when mapping a given neural network to a given hardware implementation. Alternatively, it may be defined manually by a designer of the hardware implementation. However, the use of software facilitates the mapping of a variety of different neural networks to a given hardware implementation.

Figure 10:
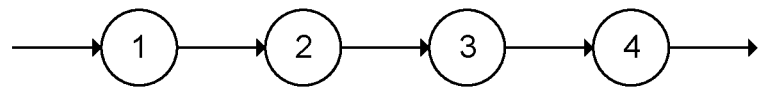
FIG. 10 illustrates a DNN with four layers and no branching.

As mentioned previously above, the plurality of layers of the neural network that are evaluated together in each pass could include all layers of the neural network, but this is not essential. The plurality of layers may consist of a subset of the layers of the overall neural network. Depending on the structure of the neural network, different groupings of layers may be found advantageous. FIG. 10 shows a simple neural network consisting of four layers, with no branches and each layer simply depending on the output of the preceding layer. This leads to a large degree of freedom in the choice of how to group the layers together. For example, the layers could be grouped into one or more pluralities of layers according to any of the following grouping strategies:

1-4
1-2, followed by 3-4
1-2, followed by 3, followed by 4
1-3, followed by 4
1, followed by 2-4
1, followed by 2-3, followed by 4
1, followed by 2, followed by 3-4

In general, there may be a preference to group as many layers as possible together, subject to the constraint of the size of the-chip memory 314.

Figure 11A:
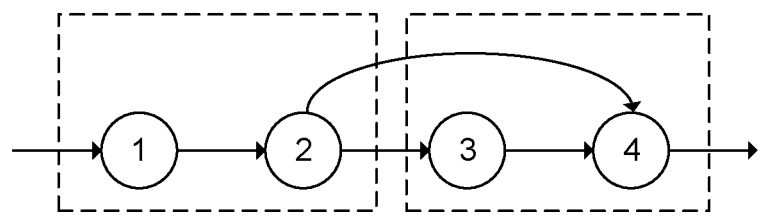
FIG. 11A illustrates an example grouping of layers for a DNN with four layers, having branching.
Figure 11B:
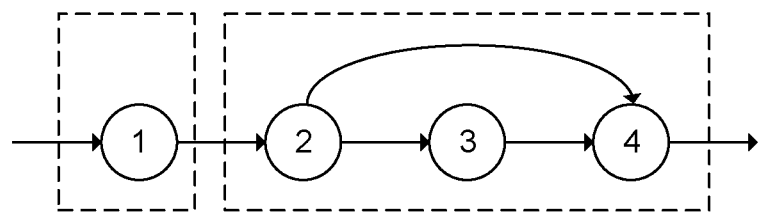
FIG. 11B illustrates an alternative example grouping, for the DNN of FIG. 11A.

FIG. 11A shows a slightly more complex network structure. Again, there are four layers, with each layer depending on the preceding layer. However, there is an additional branch from layer 2 to layer 4. In FIG. 11A, the network is split into two pluralities of two layers each (layers 1-2 and 3-4), indicated by the dashed boxes in the drawing. Note however that this might not be optimal in terms of memory access requirements. The output of layers 1-2 will be written to the DDR 312. This will be read from the DDR 312 when evaluating layer 3 (the first layer of layers 3-4); however, the output of layer 2 is also needed for the evaluation of layer 4. Therefore, the same data will have to be read a second time from the DDR 312 in order to evaluate layer 4. In contrast, FIG. 11B shows an alternative grouping of the layers, which may be more efficient in terms of memory access requirements. Here, layer 1 is processed by itself, and layers 2-4 are grouped into a plurality of layers. By doing this, both of the branches are captured within the plurality of layers. The output data of layer 1 will be read once from the DDR 312, as input data for the first layer (layer 2) of the plurality of layers. The output data of layer 2 can be handled within the plurality of layers, using the memory management strategy described above with reference to FIG. 9.

At the outset, referring to FIG. 2 above, the example was given of a convolutional layer of a neural network, operating on two-dimensional (2D) image data in a plurality of p planes or feature maps. Example hardware implementations according to the present disclosure are indeed useful for such neural network layers. However, the present disclosure is not limited in this way. The principles described above can be applied to 1D, 2D or higher dimensional data. When applied to 2D (or higher dimensional) data, the blocks of input and output data can be constructed in a variety of ways. Each block can be defined in one, two, or more dimensions. For example, for 2D image data, a block defined in one dimension may form a 2D stripe (in a horizontal or vertical direction). The overlap data may be defined above and below the stripe (for a horizontal stripe) or to the left and right of the stripe (for a vertical stripe). The diagrams of FIGS. 5, 6, and 7 are drawn with this in mind. (They are also applicable to 1D blocks defined in 1D data.) It will be understood that, although FIGS. 5-8 indicate data being split into blocks in the Y (height) dimension, this is non-limiting. As explained above, the same methodology can be applied in the X (width) dimension. Nevertheless, there may be a preference for splitting in one dimension versus another dimension, in some cases. For example, if the data is stored row-wise in memory, and the individual data elements do not align neatly with a burst size used to read/write the memory, then it may be preferable to split the tiles in the Y (height) dimension.

Alternatively, for 2D image data, a block may be defined in two dimensions, forming a 2D rectangle of data. The overlap data may then be defined above, below, to the left, and to the right of this rectangle. The overlap data from a current block may be useful for calculating multiple subsequent blocks of output data—for example, a block to the right of, a block below, and a block below-right of the current block (assuming blocks are processed in raster-scan order). The same principles can likewise be extended to blocks in a higher number of dimensions, with overlap data in multiple directions in the multidimensional space.

A processing system may comprise a hardware implementation as described above, or may be configured to perform a method as described above. The processing system may be an artificial intelligence accelerator system—such as a neural network accelerator (NNA)—or a graphics processing system/graphics processing unit (GPU).

Figure 12:
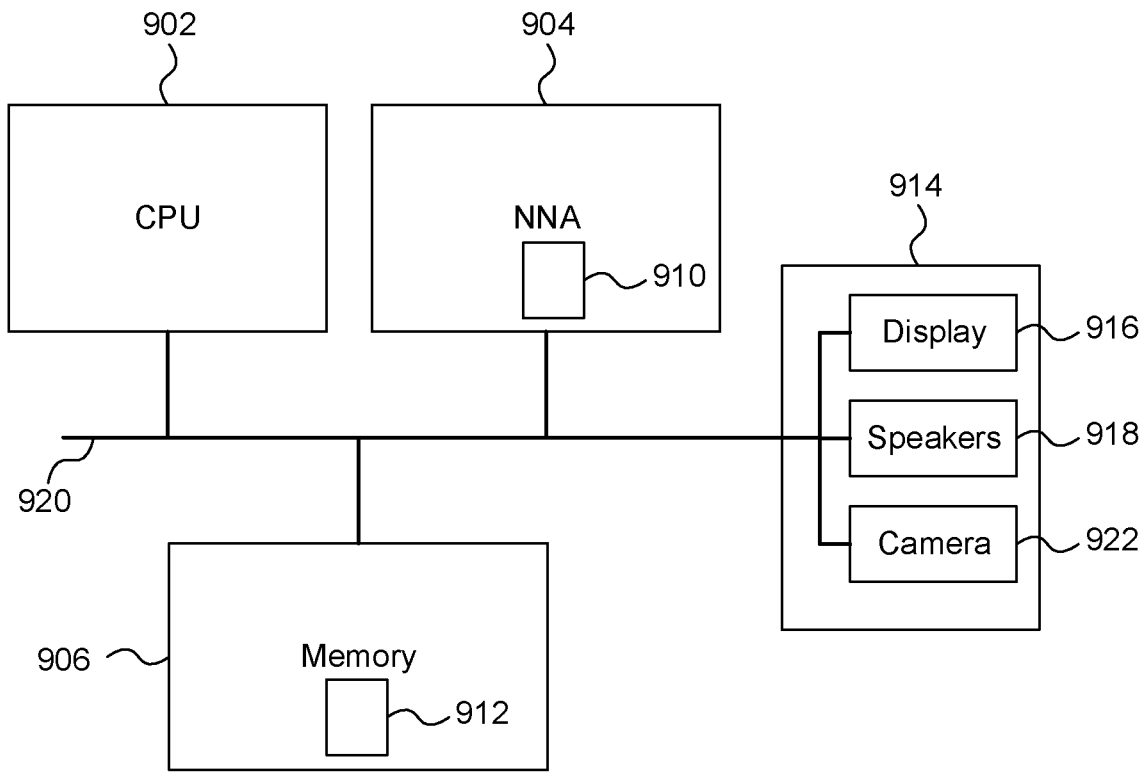
FIG. 12 shows a computer system in which an artificial intelligence accelerator system is implemented.

FIG. 12 shows a computer system in which a processing system (for example, NNA) as mentioned above may be implemented. The computer system comprises a CPU 902, a NNA 904, a memory 906 and other devices 914, such as a display 916, speakers 918 and a camera 922. A processing block 910 (corresponding to hardware implementation 300) is implemented on the NNA 904. In other examples, the processing block 910 may be implemented on the CPU 902. The components of the computer system can communicate with each other via a communications bus 920. A store 912 (corresponding to DDR 312) is implemented as part of the memory 906.

The hardware implementation 300 of FIG. 3 is shown as comprising a number of functional blocks. This is schematic only and is not intended to define a strict division between different logic elements of such entities. Each functional block may be provided in any suitable manner. It is to be understood that intermediate values described herein as being formed by a hardware implementation need not be physically generated by the hardware implementation at any point and may merely represent logical values that conveniently describe the processing performed by the hardware implementation between its input and output.

The hardware implementations described herein may be embodied in hardware on an integrated circuit. The hardware implementations described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a hardware implementation configured to perform any of the methods described herein, or to manufacture a hardware implementation comprising any apparatus described herein. An integrated circuit definition dataset may be, for example, an integrated circuit description.

Therefore, there may be provided a method of manufacturing, at an integrated circuit manufacturing system, a hardware implementation as described herein. Furthermore, there may be provided an integrated circuit definition dataset that, when processed in an integrated circuit manufacturing system, causes the method of manufacturing a hardware implementation to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS (RTM) and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a hardware implementation or processing system as described above will now be described with respect to FIG. 13.

Figure 13:
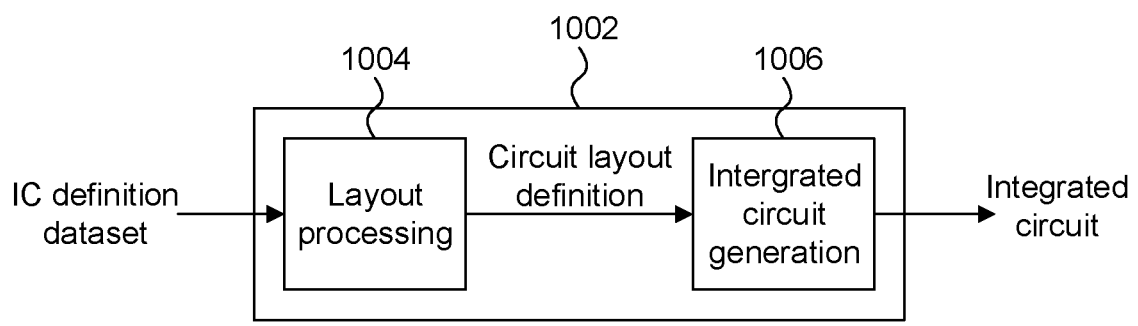
FIG. 13 shows an integrated circuit manufacturing system for generating an integrated circuit embodying an artificial intelligence accelerator system.

FIG. 13 shows an example of an integrated circuit (IC) manufacturing system 1002 which is configured to manufacture a hardware implementation or processing system as described in any of the examples herein. In particular, the IC manufacturing system 1002 comprises a layout processing system 1004 and an integrated circuit generation system 1006. The IC manufacturing system 1002 is configured to receive an IC definition dataset (e.g. defining a hardware implementation or processing system as described in any of the examples herein), process the IC definition dataset, and generate an IC according to the IC definition dataset (e.g. which embodies a hardware implementation or processing system as described in any of the examples herein). The processing of the IC definition dataset configures the IC manufacturing system 1002 to manufacture an integrated circuit embodying a hardware implementation or processing system as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a hardware implementation or processing system without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 13 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 13, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of processing data in a hardware implementation of a neural network, the hardware implementation comprising one or more first memory devices, one or more second memory devices and one or more processing elements, the neural network including a plurality of layers, the method comprising:
   providing, in the one or more first memory devices, weight data representing weights for the plurality of layers and input data for the plurality of layers;
   reading, from the one or more first memory devices, a first subset of the input data, representing a first block of the input data;
   reading, from the one or more first memory devices, the weight data;
   processing, by the one or more processing elements, the weight data and the first subset of the input data, to evaluate each layer of the plurality of layers and thereby calculate a first block of output data, wherein the first block of output data comprises more than one output data element and is calculated in one pass,
   wherein evaluating at least one layer subsequent to a first layer of the plurality of layers comprises:
      reading output data of a preceding layer from the one or more second memory devices;
      processing, by the one or more processing elements, the weight data and the output data of the preceding layer to evaluate the at least one layer, and thereby calculate output data of the at least one layer; and
      writing the output data of the at least one layer into the one or more second memory devices to be read during the evaluation of a subsequent layer; and
   writing the first block of output data to the one or more first memory devices, wherein at least one of the plurality of layers is a convolutional layer.

2. The method of claim 1, further comprising, after reading the weight data from the one or more first memory devices, writing the weight data to the one or more second memory devices,
the method comprising, before evaluating each layer, reading the weight data for that layer from the one or more second memory devices.

3. The method of claim 1, further comprising, when calculating output data of the at least one layer:
identifying a disposable portion of the output data of the at least one layer, which can be deleted after calculating the first block of output data; and
identifying a non-disposable portion of the output data of the at least one layer, which should be retained after calculating the first block of output data, to be used for calculating at least one other block of output data.

4. The method of claim 3, comprising, when writing the output data of the at least one layer to the one or more second memory devices:
writing the disposable portion to a first section of the one or more second memory devices; and
writing the non-disposable portion to a second, different section of the one or more second memory devices.

5. The method of claim 4, wherein, when evaluating a further layer of the plurality of layers, at least part of the disposable portion of the output data is overwritten.

6. The method of claim 5, wherein the disposable portion is overwritten by a disposable portion of output data of the further layer.

7. The method of claim 4, wherein the second section of the one or more second memory devices is double buffered.

8. The method of claim 4, further comprising, when evaluating the subsequent layer to the at least one layer:
reading the disposable portion from the first section of the one or more second memory devices;
reading the non-disposable portion from the second section of the one or more second memory devices; and
using the disposable portion and the non-disposable portion in the calculation of the output of said subsequent layer.

9. The method of claim 3, further comprising:
reading, from the one or more first memory devices, a second subset of the input data, representing a second block of the input data;
reading, from the one or more second memory devices, a non-disposable portion of output data from at least one of the plurality of layers, which was previously written to the one or more second memory devices during the calculation of the first block of output data;
processing the weight data, the non-disposable portion, and the second subset of the input data to evaluate the plurality of layers, and thereby calculate a second block of output data; and
writing the second block of output data to the one or more first memory devices.

10. The method of claim 1, wherein processing the weight data and the first subset of the input data comprises:
processing the weight data and the first subset of the input data to evaluate the first layer of the plurality of layers, and thereby calculate output data of the first layer; and
writing the output data of the first layer to the one or more second memory devices to be read during the evaluation of the next subsequent layer of the plurality of layers.

11. A hardware implementation of a neural network including a plurality of layers at least one of which is a convolutional layer, the hardware implementation comprising:
one or more first memory devices, configured to store:
weight data representing weights for the plurality of layers; and
input data for the plurality of layers,
one or more second memory devices,
an input buffer, configured to obtain a first subset of the input data, representing a first block of the input data,
a coefficient buffer, configured to obtain the weight data,
one or more processing elements, configured to process the weight data and the first subset of the input data, to evaluate each layer of the plurality of layers and thereby calculate a first block of output data, wherein the first block of output data comprises more than one output data element and is calculated in one pass, and
an output buffer, configured to output the first block of output data,
wherein, to evaluate at least one layer subsequent to a first layer of the plurality of layers:
the input buffer is configured to read, from the one or more second memory devices, output data of a preceding layer;
the one or more processing elements are configured to process the weight data and the output data of the preceding layer to evaluate the at least one layer, and thereby calculate output data of the at least one layer; and
the output buffer is configured to write the output data of the at least one layer into the one or more second memory devices to be read during the evaluation of a subsequent layer.

12. The hardware implementation of claim 11, wherein the one or more second memory devices are configured to obtain the weight data from the one or more first memory devices,
and the coefficient buffer is configured to, before each layer is evaluated, read the weight data for that layer from the one or more second memory devices.

13. The hardware implementation of claim 11, wherein, when the output data of the at least one layer of the plurality of layers has been calculated, the output buffer is configured to:
identify a disposable portion of the output data of the at least one layer, which can be deleted after calculating the first block of output data; and
identify a non-disposable portion of the output data of the at least one layer, which should be retained after calculating the first block of output data, to be used for calculating at least one other block of output data.

14. The hardware implementation of claim 13, wherein when writing the output data of the at least one layer to the one or more second memory devices, the output buffer is configured to:
write the disposable portion to a first section of the one or more second memory devices; and
write the non-disposable portion to a second, different section of the one or more second memory devices.

15. The hardware implementation of claim 14, wherein, when a further layer of the plurality of layers is evaluated, the output buffer is configured to overwrite at least part of the disposable portion of the output data.

16. The hardware implementation of claim 15, wherein the output buffer is configured to overwrite the disposable portion by a disposable portion of output data of the further layer.

17. The hardware implementation of claim 14, wherein the second section of the one or more second memory devices is double buffered.

18. The hardware implementation of claim 14, wherein, when the subsequent layer to the at least one layer is evaluated:
- the input buffer is configured to read the disposable portion from the first section of the one or more second memory devices;
- the input buffer is configured to read the non-disposable portion from the second section of the one or more second memory devices; and
- the one or more processing elements are configured to use the disposable portion and the non-disposable portion in the calculation of the output of said subsequent layer.

19. The hardware implementation of claim 14, wherein:
- the input buffer is configured to obtain a second subset of the input data, representing a second block of the input data;
- the input buffer is configured to read, from the one or more second memory devices, a non-disposable portion of output data from at least one of the plurality of layers, which was previously written to the one or more second memory devices during the calculation of the first block of output data;
- the one or more processing elements are configured to process the weight data, the non-disposable portion, and the second subset of the input data to evaluate the plurality of layers, and thereby calculate a second block of output data; and
- the output buffer is configured to output the second block of output data.

20. A non-transitory computer readable storage medium having encoded thereon computer readable code configured to cause to be performed, when the code is run, a method of processing data in a hardware implementation of a neural network, the hardware implementation comprising one or more first memory devices, one or more second memory devices and one or more processing elements, the neural network including a plurality of layers, the method comprising:
- providing, in the one or more first memory devices, weight data representing weights for the plurality of layers and input data for the plurality of layers;
- reading, from the one or more first memory devices, a first subset of the input data, representing a first block of the input data;
- reading, from the one or more first memory devices, the weight data;
- processing, by the one or more processing elements, the weight data and the first subset of the input data, to evaluate each layer of the plurality of layers and thereby calculate a first block of output data, wherein the first block of output data comprises more than one output data element and is calculated in one pass,
- wherein evaluating at least one layer subsequent to a first layer of the plurality of layers comprises:
  - reading output data of a preceding layer from the one or more second memory devices;
  - processing, by the one or more processing elements, the weight data and the output data of the preceding layer to evaluate the at least one layer, and thereby calculate output data of the at least one layer; and
  - writing the output data of the at least one layer into the one or more second memory devices to be read during the evaluation of a subsequent layer; and
- writing the first block of output data to the one or more first memory devices,
- wherein at least one of the plurality of layers is a convolutional layer.

* * * * *